(12) United States Patent
Li et al.

(10) Patent No.: US 12,532,508 B2
(45) Date of Patent: Jan. 20, 2026

(54) SEMICONDUCTOR DEVICE AND ELECTRONIC DEVICE

(71) Applicant: Wuhan China Star Optoelectronics Technology Co., Ltd., Hubei (CN)

(72) Inventors: Zhifu Li, Hubei (CN); Guanghui Liu, Hubei (CN); Chao Dai, Hubei (CN); Fei Ai, Hubei (CN); Dewei Song, Hubei (CN); Chengzhi Luo, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 551 days.

(21) Appl. No.: 17/926,189

(22) PCT Filed: Nov. 11, 2022

(86) PCT No.: PCT/CN2022/131460
§ 371 (c)(1),
(2) Date: Nov. 18, 2022

(87) PCT Pub. No.: WO2024/045345
PCT Pub. Date: Mar. 7, 2024

(65) Prior Publication Data
US 2024/0234577 A1    Jul. 11, 2024

(30) Foreign Application Priority Data
Aug. 30, 2022   (CN) .......................... 202211051194.9

(51) Int. Cl.
*H10D 30/67*    (2025.01)
*H10D 64/23*    (2025.01)

(52) U.S. Cl.
CPC ..... *H10D 30/6728* (2025.01); *H10D 30/6729* (2025.01); *H10D 30/6735* (2025.01); *H10D 64/252* (2025.01)

(58) Field of Classification Search
CPC .......... H10D 30/6728; H10D 64/2521; H10D 30/6735; H10D 30/6729
See application file for complete search history.

(56) References Cited

U.S. PATENT DOCUMENTS 5,937,283 A    8/1999  Lee
9,450,101 B2   9/2016  Yuan
(Continued)

FOREIGN PATENT DOCUMENTS

CN    103022150    4/2013
CN    114005838    2/2022
(Continued)

OTHER PUBLICATIONS

International Search Report and the Written Opinion Dated Jan. 18, 2013 From the International Searching Authority Re. Application No. PCT/CN2022/131460 and Its Translation Into English. (17 Pages).

(Continued)

*Primary Examiner* — Richard A Booth (57) ABSTRACT

A semiconductor device and an electronic device are provided. A through hole is formed in an insulating layer and located on a first active layer. A thin-film transistor layer includes a third active layer. At least part of the third active layer is located on a sidewall of the through hole. One side of the third active layer is connected to a first active layer, and the other side of the third active layer is connected to a second active layer, so that a channel length is reduced, short channel effect is reduced, on-state current is increased, and power consumption is reduced.

20 Claims, 8 Drawing Sheets (56) References Cited

U.S. PATENT DOCUMENTS

| | | |
|---|---|---|
| 2016/0093611 A1 | 3/2016 | Cheng et al. |
| 2016/0233343 A1* | 8/2016 | Miyairi .............. H10D 30/6739 |
| 2019/0072796 A1 | 3/2019 | Li |
| 2024/0258340 A1 | 8/2024 | Luo |

FOREIGN PATENT DOCUMENTS

| | | |
|---|---|---|
| CN | 114267740 | 4/2022 |
| JP | 2010-040815 | 2/2010 |
| JP | 2012-174836 | 9/2012 |
| KR | 10-2022-0052396 | 4/2022 |
| WO | WO 2019/041553 | 3/2019 |

OTHER PUBLICATIONS

Notification of Office Action and Search Report Dated Jun. 19, 2025 From The State Intellectual Property Office of the People's Republic of China Re. Application No. 202211051194.9 and Its Translation Into English. (21 Pages).

* cited by examiner

100
SEMICONDUCTOR DEVICE AND ELECTRONIC DEVICE

RELATED APPLICATIONS

This application is a National Phase of PCT Patent Application No. PCT/CN2022/131460 having International filing date of Nov. 11, 2022, which claims the benefit of priority of China Patent Application No. 202211051194.9 filed on Aug. 30, 2022. The contents of the above applications are all incorporated by reference as if fully set forth herein in their entirety.

FIELD AND BACKGROUND OF THE INVENTION

The present application relates to a technical field of displays, and particularly to a semiconductor device and an electronic device.

Current flat display devices, such as liquid crystal display (LCD) and organic light-emitting diode (OLED) mobile terminals, due to their advantages of high image quality, power saving, being compact, and having wide-ranging applications, are commonly used in various consumer electronic products, such as mobile phones, televisions, personal digital assistants, digital cameras, notebook computers, desktop computers, etc., and have become a mainstream of display devices.

In prior art, it is known that integrating integrated circuit (IC) circuits, such as pixel, driving, multiplexing, control, and logic circuits on a glass substrate (system on glass, SOG) can improve integration of semiconductor devices and reduce dependency on IC chips. In order to achieve SOG, it is necessary to improve the integration, maximum operating frequency, and current density of conventional thin-film transistors (TFTs). Specifically, since electrical performance of thin-film transistors when turned on is related to portions of active layers corresponding to portions between source electrodes and drain electrodes (i.e., a channel length of the active layers), in order to achieve the above-mentioned effects, it is necessary to make thin-film transistors have shorter channel lengths and smaller volumes. However, conventional thin-film transistors are generally a planar type in structure. When an "I-shaped" active layer is fabricated on an insulating substrate by current exposure equipment, a minimum size of a mask pattern is generally greater than 2 microns. Therefore, it is difficult to achieve short channelization of the thin-film transistors in prior art. As a result, how to shorten channel lengths of thin-film transistors and reduce area occupied by the thin-film transistors in entire display panels under the premise of normal operation of thin-film transistor devices is a technical problem to be solved urgently by those skilled in the art.

SUMMARY OF THE INVENTION

Embodiments of the present application provide a semiconductor device and an electronic device to alleviate the deficiencies in prior art.

An embodiment of the application provides a semiconductor device, including an insulating substrate and a thin-film transistor layer disposed on the insulating substrate. The thin-film transistor layer includes a first active layer, an insulating layer, and a second active layer disposed on the insulating substrate in a stacked arrangement. The insulating layer is disposed between the first active layer and the second active layer and covers the first active layer.

The insulating layer defines a through hole located on the first active layer, and the thin-film transistor layer further includes a third active layer, wherein at least part of the third active layer is located on a sidewall of the through hole, one side of the third active layer is connected to the first active layer, and the other side of the third active layer is connected to the second active layer.

In the semiconductor device provided in one embodiment of the present application, the thin-film transistor layer further includes a first metal layer disposed in the insulating layer, the first metal is insulated from the first active layer, and the first metal layer is located at least on a side of the through hole.

In the semiconductor device provided in one embodiment of the present application, the first metal layer is disposed around the third active layer on the sidewall of the through hole.

In the semiconductor device provided in one embodiment of the present application, the first active layer includes a first conductor portion doped with ions, and the second active layer includes a second conductor portion doped with ions. An orthographic projection of the first conductor portion on the insulating substrate at least overlaps part of an orthographic projection of the second conductor portion on the insulating substrate. One side of the third active layer is connected to the first conductor portion, and the other side of the third active layer is connected to the second conductor portion.

In the semiconductor device provided in one embodiment of the present application, a dopant ion concentration of the second conductor portion is less than a dopant ion concentration of the first conductor portion.

In the semiconductor device provided in one embodiment of the present application, the thin-film transistor layer includes a second metal layer located on a side of the second active layer away from the insulating layer, and the second metal layer includes a first electrode connected to the first conductor portion and a second electrode connected to the second conductor portion.

The first conductor portion includes a first conductor sub-portion connected to the third active layer, and a second conductor sub-portion connected to the first electrode. An orthographic projection of the second conductor sub-portion on the insulating substrate does not overlap the orthographic projection of the second conductor portion on the insulating base.

In the semiconductor device provided in one embodiment of the present application, the second conductor portion includes a third conductor sub-portion connected to the third active layer, and a fourth conductor sub-portion connected to the second electrode. A dopant ion concentration of the first conductor sub-portion is less than a dopant ion concentration of the second conductor sub-portion, and a dopant ion concentration of the third conductor sub-portion is less than a dopant ion concentration of the fourth conductor sub-portion.

In the semiconductor device provided in one embodiment of the present application, the first conductor sub-portion is connected to the side of the third active layer, and the third conductor sub-portion is connected to the other side of the third active layer.

In the semiconductor device provided in one embodiment of the present application, the thin-film transistor layer includes a channel located between the first active layer and the second active layer, and a length of the channel and a depth of the through hole satisfy the following relationship:

$$L \equiv \frac{H}{\operatorname{Sin}(\alpha)}.$$

L represents the length of the channel, H represents the depth of the through hole, and α represents an angle between the third active layer on the sidewall of the through hole and a bottom of the through hole.

In the semiconductor device provided in one embodiment of the present application, the angle α between the third active layer on the sidewall of the through hole and the bottom of the through hole is greater than 90 degrees and less than or equal to 120 degrees.

In the semiconductor device provided in one embodiment of the present application, the length of the channel in a direction perpendicular to the insulating substrate is greater than or equal to 3000 angstroms and less than or equal to 10000 angstroms.

In the semiconductor device provided in one embodiment of the present application, the third active layer includes a first active subsection and a second active subsection that are connected to each other, the first active subsection is located on a side of the insulating layer away from the insulating substrate, the first active subsection is connected to the second active layer, and the second active subsection extends along the sidewall of the through hole and is connected to the first active layer.

In the semiconductor device provided in one embodiment of the present application, the thin-film transistor layer further includes a barrier layer disposed between the insulating layer and the second active layer, and at least part of the barrier layer is located in the through hole.

In the semiconductor device provided in one embodiment of the present application, a side of the barrier layer close to the second active layer is flush with a side of the insulating layer close to the second active layer.

In the semiconductor device provided in one embodiment of the present application, the third active layer is disposed on the sidewall and the bottom of the through hole and extends to a side of the insulating layer away from the insulating substrate.

In the semiconductor device provided in one embodiment of the present application, the insulating layer includes a first insulating layer and a second insulating layer disposed on the insulating substrate, the first insulating layer is located on the first active layer and covers the first active layer, and the second active layer covers the first active layer.

A first through hole is defined in the first insulating layer and located on the first active layer, and a second through hold is defined in the second insulating layer and located on the first active layer. The second through hole communicates with the first through hole, and an angle between a sidewall of the second through hole and the first active layer is equal to an angle between a sidewall of the first through hole and the first active layer.

An embodiment of the present application provides an electronic device, including a semiconductor device. The semiconductor device includes an insulating substrate and a thin-film transistor layer disposed on the insulating substrate. The thin-film transistor layer includes a first active layer, an insulating layer, and a second active layer disposed on the insulating substrate in a stacked arrangement. The insulating layer is disposed between the first active layer and the second active layer and covers the first active layer.

The insulating layer defines a through hole located on the first active layer, and the thin-film transistor layer further includes a third active layer. At least part of the third active layer is located on a sidewall of the through hole, one side of the third active layer is connected to the first active layer, and the other side of the third active layer is connected to the second active layer.

In the electronic device provided in one embodiment of the present application, the thin-film transistor layer further includes a first metal layer disposed in the insulating layer, the first metal is insulated from the first active layer, and the first metal layer is located at least on a side of the through hole.

In the electronic device provided in one embodiment of the present application, the first active layer includes a first conductor portion doped with ions, and the second active layer includes a second conductor portion doped with ions. An orthographic projection of the first conductor portion on the insulating substrate at least overlaps part of an orthographic projection of the second conductor portion on the insulating substrate. One side of the third active layer is connected to the first conductor portion, and the other side of the third active layer is connected to the second conductor portion.

In the electronic device provided in one embodiment of the present application, the third active layer includes a first active subsection and a second active subsection that are connected to each other, the first active subsection is located on a side of the insulating layer away from the insulating substrate, the first active subsection is connected to the second active layer, and the second active subsection extends along the sidewall of the through hole and is connected to the first active layer.

The present application has advantageous effects as follows: the embodiments of the present application provide the semiconductor device and the electronic device. The semiconductor device includes the insulating substrate and the thin-film transistor layer disposed on the insulating substrate. The thin-film transistor layer includes the first active layer, the insulating layer, and the second active layer. The insulating layer is disposed between the first active layer and the second active layer and covers the first active layer. In the embodiments of the present application, the through hole is formed in the insulating layer and located on the first active layer, and the thin-film transistor layer further includes the third active layer. At least part of the third active layer is located on the sidewall of the through hole, one side of the third active layer is connected to the first active layer, and the other side of the third active layer is connected to the second active layer, thereby shortening a channel length, reducing short channel effect, increasing on-state current, and lowering power consumption. In addition, area occupied by the semiconductor device is further reduced and the integration degree of the semiconductor device is improved, which is beneficial for development of high pixels per inch (ppi) and high refresh rate products, and achievement of certain integrated circuit (IC) functions.

BRIEF DESCRIPTION OF THE SEVERAL VIEWS OF THE DRAWINGS

The technical solutions and other advantageous effects of the present application will be apparent through the detailed description of the specific embodiments of the present application in conjunction with the accompanying drawings.

DESCRIPTION OF SPECIFIC EMBODIMENTS OF THE INVENTION

The embodiments of the present application provide a display panel, a method of manufacturing the same, and a mobile terminal. In order to make the purpose, technical solutions, and effects of the present application clearer, the present application will be further described below with reference to the accompanying drawings and embodiments. It should be understood that the specific embodiments described herein are only used to explain the present application, but not to limit the present application.

Embodiments of the present application provide a semiconductor device and an electronic device. Each of them will be described in detail below. It should be noted that the description order of the following embodiments is not intended to limit the preferred order of the embodiments.

Referring to FIGS. 3 to 11G, the embodiments of the present application provide the semiconductor device and the electronic device. The semiconductor device includes an insulating substrate 10 and a thin-film transistor layer 40 disposed on the insulating substrate 10. The thin-film transistor layer 40 includes a first active layer 41, an insulating layer 44, and a second active layer 42 disposed on the insulating substrate 10 in a stacked arrangement. The insulating layer 44 is disposed between the first active layer 41 and the second active layer 42 and covers the first active layer 41.

Specifically, the insulating layer 44 forms a through hole 44C located on the first active layer 41, and the thin-film transistor layer 40 further includes a third active layer 43. At least part of the third active layer 43 is located on a sidewall 44C1 of the through hole 44C, one side of the third active layer 43 is connected to the first active layer 41, and the other side of the third active layer 43 is connected to the second active layer 42.

Figure 1:
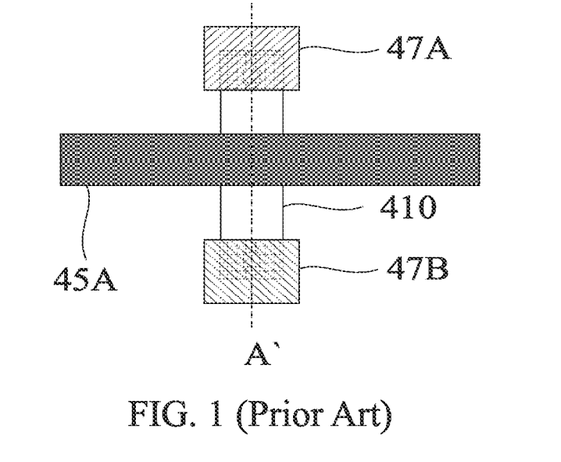
FIG. 1 is a top cross-sectional view of a conventional thin-film transistor.
Figure 2:
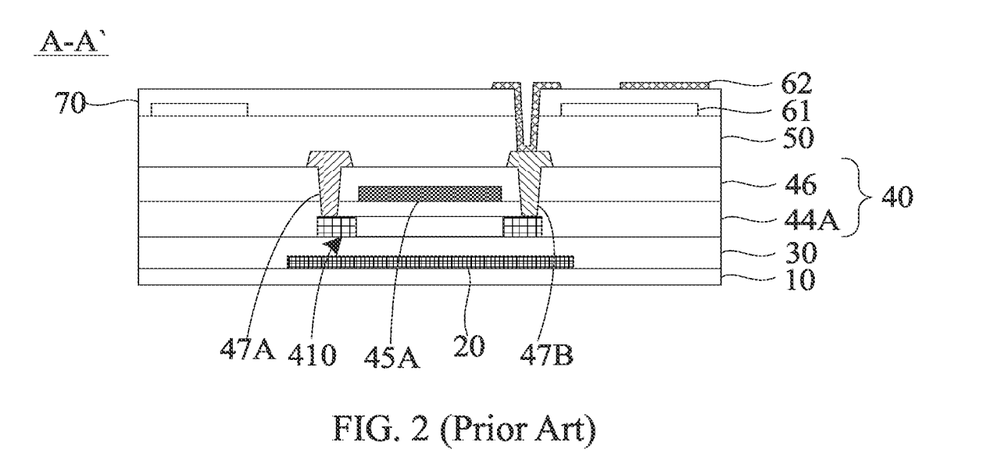
FIG. 2 is a schematic cross-sectional view of the conventional thin-film transistor taken along line A-A' in FIG. 1.

Referring to FIGS. 1 and 2, FIG. 1 is a top cross-sectional view of a conventional thin-film transistor, and FIG. 2 is a schematic cross-sectional view of the conventional thin-film transistor taken along line A-A' in FIG. 1.

A current thin-film transistor includes an insulating substrate 10, and a light shielding layer 20, a first buffer layer 30, an active layer 410, a gate insulating layer 44, a gate electrode 45A, an interlayer dielectric layer 46, a source electrode 47A, a drain electrode 47B, a planarization layer 50, a common electrode 61, a passivation layer 70, and a pixel electrode 62 that are sequentially disposed on the insulating substrate 10. It should be noted that this embodiment does not specifically limit the types of the current thin-film transistor. In this embodiment, the technical solution of the present application is only illustrated by taking a conventional display panel including a top-gate thin-film transistor as an example.

It can be understood that with ever-changing development of display panel industries, consumers have put forward higher and higher requirements for parameters, such as narrow borders, high aperture ratio, high brightness, and high resolution of display panels. There is a need to improve the integration, maximum operating frequency, and current density of conventional thin-film transistors (TFTs). Since the electrical performance of the thin-film transistors when turned on is related to portions of active layers corresponding to portions between source electrodes and drain electrodes (i.e., a channel length of the active layer 410), it is necessary to make thin-film transistors have shorter channel lengths and smaller volumes. But in traditional thin-film transistor fabrication processes, thin-film transistors are generally a planar type. When an "I-shaped" type active layer is fabricated on an insulating substrate by current exposure equipment, a minimum size of a mask pattern is generally greater than 2 microns (μm), so in prior art, it is difficult to achieve short channelization of the thin-film transistor.

In this embodiment of the present application, a through hole is formed in an insulating layer and located on a first active layer, and a thin-film transistor layer further includes a third active layer. At least part of the third active layer is located on a sidewall of the through hole, one side of the third active layer is connected to the first active layer, and the third active layer is connected to the second active layer, thereby reducing a channel length, reducing short channel effect, increasing the on-state current, and reducing power consumption. In addition, an area occupied by the semiconductor device is further reduced and the integration degree of the semiconductor device is improved, which is beneficial for development of high pixels per inch (ppi) and high refresh rate products. Furthermore, since the semiconductor device provided in this embodiment is provided with the characteristics of small size and high integration, functions, such as data storage and voltage conversion of an integrated chip (IC) can also be realized.

The technical solution of the present application will now be described in combination with specific embodiments.

Figure 3:
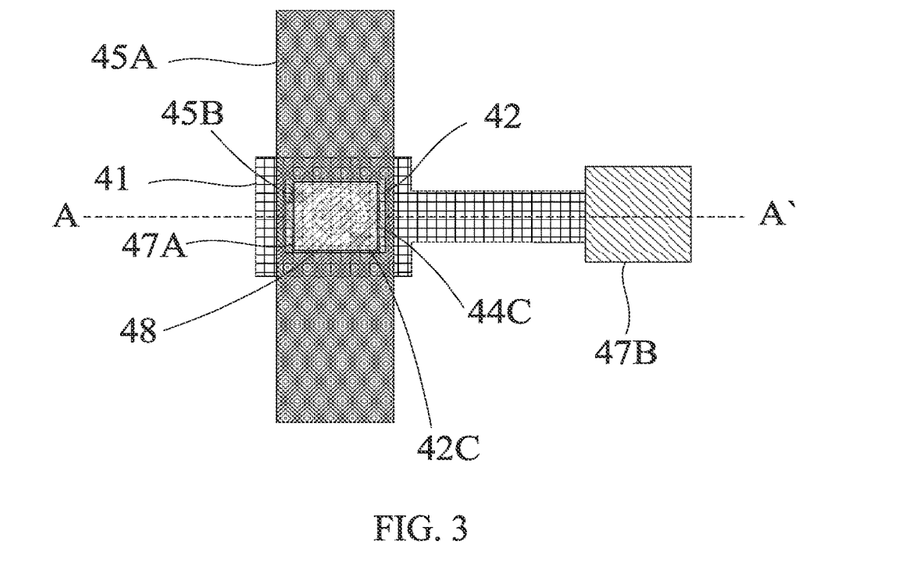
FIG. 3 is a top cross-sectional view of a semiconductor device according to an embodiment of the present application.
Figure 4:
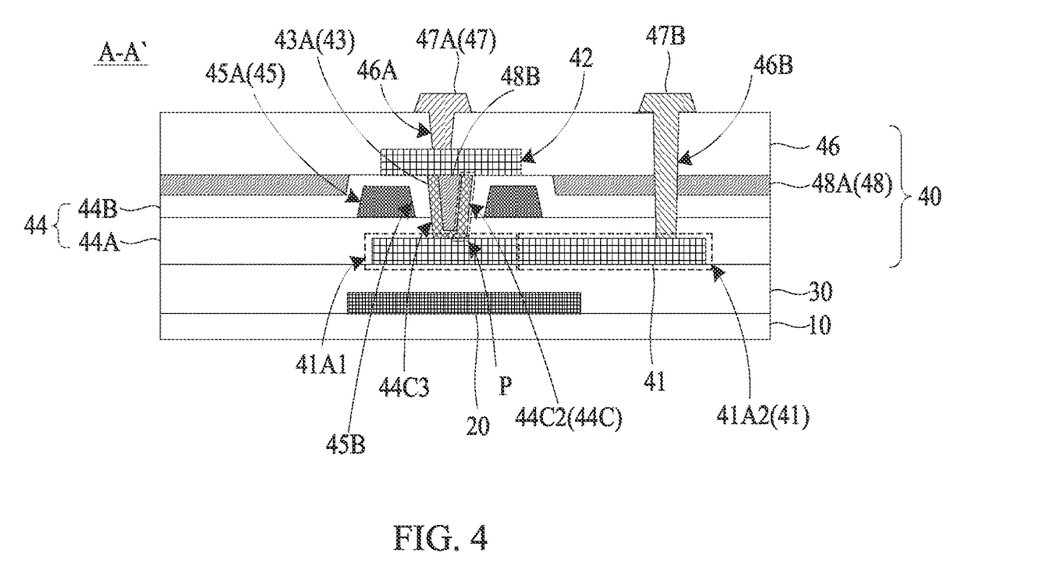
FIG. 4 is a first cross-sectional view taken along line A-A' in FIG. 3.
Figure 5:
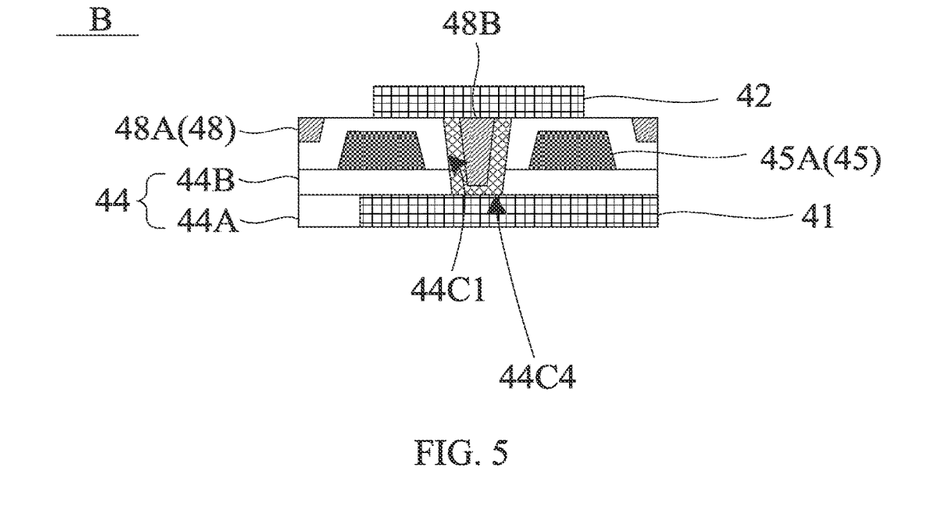
FIG. 5 is an enlarged view of portion B of FIG. 4.

In one embodiment, please refer to FIGS. 3, 4, and 5. Specifically, FIG. 3 is a top cross-sectional view of a semiconductor device according to an embodiment of the present application. FIG. 4 is a first cross-sectional view taken along line A-A' in FIG. 3. FIG. 5 is an enlarged view of portion B of FIG. 4.

In this embodiment, the semiconductor device includes an insulating substrate 10 and a thin-film transistor layer 40 disposed on the insulating substrate 10, and the insulating substrate 10 may include a rigid substrate or flexible substrate, a material of the insulating substrate 10 is not specifically limited in this embodiment.

The thin-film transistor layer 40 includes a first active layer 41, an insulating layer 44, and a second active layer 42 that are disposed on the insulating substrate 10 in a stacked arrangement. The insulating layer 44 is disposed between the first active layer 41 and the second active layer 42 and covers the first active layer 41. Specifically, a through hole 44C is formed in the insulating layer 44 and located on the first active layer 41. The thin-film transistor layer 40 further includes a third active layer 43. At least part of the third active layer 43 is located on a sidewall 44C1 of the through hole 44C. One side of the third active layer 43 is connected to the first active layer 41, and the other side of the third active layer 43 is connected to the second active layer 42.

Specifically, the thin-film transistor layer 40 includes at least a thin-film transistor (not labeled in the drawings). The thin-film transistor includes the first active layer 41, the third active layer 43, and the second active layer 42 sequentially stacked on the insulating substrate 10. Further, the first active layer 41 is a first conductor portion 41 doped with ions, the second active layer 42 is a second conductor portion 42 doped with ions, and the third active layer 43 includes an active segment 43A located on the sidewall 44C1 of the through hole 44C. An orthographic projection of the first conductor portion 41 on the insulating substrate 10 at least overlaps part of an orthographic projection of the second conductor portion 42 on the insulating substrate 10. One side of the active segment 43A is connected to the first conductor portion 41, and the other side of the active segment 43A is connected to the second conductor portion 42.

It can be understood that, in this embodiment, by means of disposing the first active layer 41, the insulating layer 44, and the second active layer 42 in a stacked arrangement on the insulating substrate 10, the insulating layer 44 is arranged between the first active layer 41 and the second active layer 42 and covers the first active layer 41, and the insulating layer 44 is formed with the through hole 44C on the first active layer 41. The thin-film transistor layer 40 further includes the third active layer 43 having at least a part located on the sidewall 44C1 of the through hole 44C. One side of the third active layer 43 is connected to the first active layer 41, and the other side of the third active layer 43 is connected to the second active layer 42. Specifically, the first active layer 41 is the first conductor portion 41 doped with ions, the second active layer 42 is the second conductor portion 42 doped with ions, and the third active layer 43 includes the active segment 43A located on the sidewall 44C1 of the through hole 44C, that is, in this embodiment, a channel P of the thin-film transistor is located on the sidewall 44C1 of the through hole 44C.

Specifically, in this embodiment, the channel P is located between the first active layer 41 and the second active layer 42, and a length of the channel P and a depth of the through hole 44C satisfy the following relationship:

$$L \equiv \frac{H}{\mathrm{Sin}(\alpha)} \quad (1)$$

Specifically, L represents the length of the channel P, H represents the depth of the through hole 44C, and α represents an angle between the sidewall 44C1 of the through hole 44C and a bottom 44C4 of the through hole 44C.

Further, in a direction perpendicular to the insulating substrate 10, the sidewall 44C1 of the through hole 44C is linear-like in shape in cross-section. The angle α between the sidewall 44C1 of the through hole 44C and the bottom 44C4 of the through hole 44C is greater than 90 degrees and less than or equal to 120 degrees. Preferably, the angle α is preferably 95 degrees, 100 degrees, 110 degrees or 120 degrees. The depth of the through hole 44C is greater than or equal to 0.3 microns and less than or equal to 1 micron, wherein the depth of the through hole 44C is preferably 0.03 microns, 0.5 microns, or 1 micrometer. In the direction perpendicular to the insulating substrate 10, the length of the channel P is greater than or equal to 3000 angstroms and less than or equal to 10000 angstroms.

It can be understood that, in this embodiment, the length of the channel P of the thin-film transistor can be determined by the depth of the through hole 44C. Therefore, compared with a traditional thin-film transistor which is limited by exposure equipment in a manufacturing process and has a length of a channel generally greater than 2 microns, in this embodiment, by means of the active segment 43A located on the sidewall 44C1 of the through hole 44C, the depth of the through hole 44C is greater than or equal to 0.3 microns and less than or equal to 1 micrometer, thereby reducing the length of the channel P, achieving a short channel of the thin-film transistor, and further reducing an area of the thin-film transistor, which is conducive to the realization of miniature thin-film transistor production.

It should be noted that, since the channel P of the thin-film transistor is located on the sidewall 44C1 of the through hole 44C, compared with the traditional thin-film transistor which is limited by exposure equipment in the manufacturing process and has a length of a channel generally greater than 2 microns, in this embodiment, by means of the active segment 43A located on the sidewall 44C1 of the through hole 44C, the length of the channel P can be controlled by controlling the depth of the through hole 44C and the angle α between the sidewall 44C1 and the bottom 44C4 of the through hole 44C. That is, the length of the channel P can be controlled independently of the exposure equipment, so as to achieve the short channelization of the thin-film transistor, thus further reducing the area of the thin-film transistor, which is conducive to achieving the fabrication of a miniature thin-film transistor. In addition, since a width of the channel P is determined by a width of the orthographic projection of the third active layer 43 on the insulating substrate 10, under the condition that the width of the channel P is constant, shortening the length of the channel P can make the thin-film transistor have a larger aspect ratio, so that a larger on-state current is obtained, thus reducing the power consumption of the thin-film transistor.

It should be noted that, in this embodiment, the semiconductor device further includes a first buffer layer 30 and a light shielding layer 20 both located between the insulating substrate 10 and the insulating layer 44. The first buffer layer 30 covers the light shielding layer 20, and an orthographic projection of the light shielding layer 20 on the insulating substrate 10 at least covers the orthographic projection of the third active layer 43 on the insulating substrate 10. Specifically, the light shielding layer 20 can shield the light directed to the third active layer 43, thereby reducing an increase in leakage current caused by the photogenerated carriers generated by light irradiating the third active layer 43, thus maintain stability of the thin-film transistor during operation.

In this embodiment, the thin-film transistor layer 40 further includes a first metal layer 45 in the insulating layer 44. The first metal layer 45 is insulated from the first active layer 41 and is located at least on one side of the through hole 44C. Preferably, the first metal layer 45 includes but is not limited to the gate 45A. The gate 45A is insulated from the first active layer 41 and is located at least on one side of the through hole 44C. Further, an orthographic projection of the gate 45A on the sidewall 44C1 of the third active layer 43 covers the active segment 43A, so that the gate 45A can adjust the channel P current of the thin-film transistor.

Specifically, an opening 45B is formed in the first metal layer 45 and is located on the first active layer 41. The opening 45B is arranged corresponding to the through hole 44C and is configured with an aperture greater than that of the through hole 44C, so that the first metal layer 45 is disposed around the third active layer 43 on the sidewall 44C1 of the through hole 44C, that is, the gate 45A is disposed around the third active layer 43 on the sidewall 44C1 of the through hole 44C. An orthographic projection of the gate 45A on the insulating substrate 10 is annular in shape, and the orthographic projection of the gate 45A on the insulating substrate 10 overlaps four sides of an orthographic projection of the active segment 43A on the insulating substrate 10. That is, a ring-shaped channel region is formed on the active segment 43A, so as to control a width of the channel region and further adjust channel current of the thin-film transistor.

It should be noted that, in this embodiment, the insulating layer 44 includes a first insulating layer 44B and a second insulating layer 44A disposed on the insulating substrate 10. The first insulating layer 44B is located on the first active layer 41 and covers the first active layer 41. The second active layer 42 covers the first metal layer 45. Preferably, the first insulating layer 44B is a second buffer layer 44, and the second insulating layer 44A is the gate insulating layer 44. Specifically, a first through hole 44C2 is formed in the first insulating layer 44B on the first active layer 41, and a second through hole 44C3 is formed in the second insulating layer 44A on the first active layer 41 and communicates with the first through hole 44C2. An angle between the sidewall 44C1 of the second through hole 44C3 and the first active layer 41 is equal to an angle between the sidewall 44C1 of the first though hole 44C2 and the first active layer 41, that is, the through hole 44C includes the first through hole 44C2 and the second through hole 44C3 that communicate with each other. It can be understood that, in this embodiment, by disposing the insulating layer 44 to include the first insulating layer 44B and the second insulating layer 44A located on the insulating substrate 10, the depth of the through hole 44C tends to be controlled, thereby facilitating the control the length of the channel P.

In this application, a material of the first active layer 41, a material of the second active layer 42, and a material of the third active layer 43 include but are not limited to amorphous silicon, polysilicon, or oxide material semiconductor material. Preferably, the first conductor portion 41 and the second conductor portion 42 are both made of silicide polysilicon doped with n-type impurities at a high concentration, and a dopant ion concentration of the second conductor portion 42 is less than a dopant ion concentration of the first conductor portion 41 . . . .

It can be understood that, in this embodiment, the second conductor portion 42 with a lower dopant ion concentration is formed on the active segment 43A, so that the dopant ions in the second conductor portion 42 are not easily diffused into the active segment 43A, which is beneficial to improve the short channel effect in a thin-film transistor structure, thereby optimizing the performance of the thin-film transistor.

It can be understood that, each of the first conductor portion 41 and the second conductor portion 42 made of silicide, polysilicon doped with n-type impurities at a high concentration is for illustration only. For example, in another embodiment, the first conductor portion 41 and the second conductor portion 42 are both N-type heavily doped amorphous silicon layers, so that when the thin-film transistor is fabricated, no additional ion implantation is required. In this case, when the second conductor portion 42 is made of silicide polysilicon doped with n-type impurities at a high concentration, a risk of plasma gas diffusing from the second conductor portion 42 into the active segment 43A is prevented.

Further, the thin-film transistor layer 40 further includes a barrier layer 48 located between the insulating layer 44 and the second active layer 42. At least part of the barrier layer 48 is located in the through hole 44C, so as to prevent the plasma gas from diffusing in a direction toward the active segment 43A when the second conductor portion 42 is formed on the third active layer 43 in order to achieve an effect of maintaining working stability of the thin-film transistor.

It should be noted that, in this embodiment, the first metal layer 45 is located in the insulating layer 44, and the first metal layer 45 is configured with a certain thickness. Therefore, in the insulating layer 44, a step is formed at a position of the first metal layer 45. In addition, since the third active layer 43 is located on the sidewall 44C1 of the through hole 44C and the bottom 44C4 of the through hole 44C, a level difference is formed at the position of the through hole 44C.

As noted above, in this embodiment, a side of the barrier layer 48 close to the second active layer 42 is flush with a side of the insulating layer 44 close to the second active layer 42. Specifically, the barrier layer 48 includes a first barrier portion 48A located on a side of the insulating layer 44 away from the insulating substrate 10, and a second barrier portion 48B located in the through hole 44C. A side of the first barrier portion 48A close to the second active layer 42 is flush with a side of the insulating layer 44 close to the second active layer 42, so as to solve a problem that an upper surface of the insulating layer 44 is uneven at a position of the first metal layer 45 due to a thickness of the first metal layer 45. A side of the second barrier portion 48B close to the second active layer 42 is flush with the side of the insulating layer 44 close to the second active layer 42, so that when the second conductor portion 42 is formed on the third active layer 43, the risk of fracture of the second conductor portion 42 at the step position is prevented.

In this embodiment, the thin-film transistor layer 40 includes a second metal layer 47 located on a side of the second active layer 42 away from the insulating layer 44. The second metal layer 47 includes a first electrode connected to the first conductor portion 41 and a second electrode connected to the second conductor portion 42. Specifically, the first electrode includes but is not limited to one of the source electrode 47A or the drain electrode 47B. The second electrode includes but is not limited to the other one of the source electrode 47A or the drain electrode 47B. In this embodiment, an example that the first electrode is the drain electrode 47B and the second electrode is the source electrode 47A is used to illustrate the technical solution of the present application.

The semiconductor device includes an interlayer dielectric layer 46 located between the second active layer 42 and the second metal layer 47, a first via hole 46A extending through the interlayer dielectric layer 46 and located on the second conductor portion 42, and a second via hole 46B extending through the interlayer dielectric layer 46, the barrier layer 48, the first insulating layer 44B and the second insulating layer 44A and located on the first conductor portion 41. Specifically, the first via hole 46A extends through the interlayer dielectric layer 46, and the second via hole 46B extends through the interlayer dielectric layer 46, the barrier layer 48, the first insulating layer 44B, and the second insulating layer 44A, so that the source electrode 47A is connected to the second conductor portion 42 through the first via hole 46A, and the drain electrode 47B is connected to the second conductor portion 42 through the second via hole 46B. Specifically, the first conductor portion 41 includes a first conductor sub-portion 41A1 connected to the third active layer 43 and a second conductor sub-portion 41A2 connected to the first electrode. An orthographic projection of the first conductor sub-portion 41A1 on the insulating substrate 10 at least overlaps part of the orthographic projection of the second conductor portion 42 on the insulating substrate 10. An orthographic projection of the second conductor sub-portion 41A2 on the insulating substrate 10 does not overlap the orthographic projection of the second conductor portion 42 on the insulating base 10.

On the basis of the above, it can be understood that in the present embodiment, in a direction from the source electrode 47A to the drain electrode 47B, a length of the first conductor portion 41 is greater than a length of the second conductor portion 42, so as to facilitate a configuration that the drain electrode 47B is connected to the first conductor portion 41. Compared with a current thin-film transistor, a spacing between the source electrode 47A and the drain electrode 47B is increased in this embodiment, so that a contact short circuit between the source electrode 47A and the drain electrode 47B is prevented, which is beneficial to improve the production yield of the product.

Figure 6:
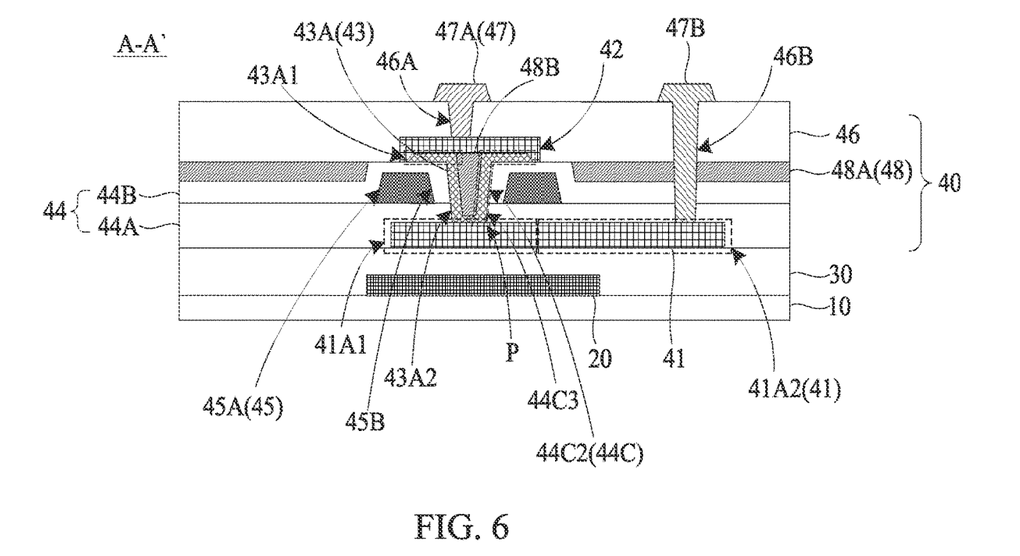
FIG. 6 is a second cross-sectional view taken along line A-A' in FIG. 3.
Figure 7:
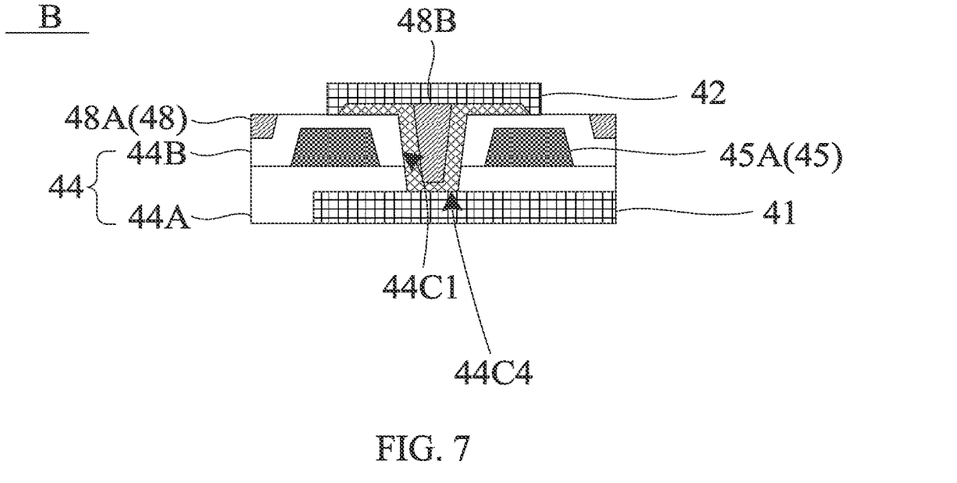
FIG. 7 is an enlarged view of portion B of FIG. 6.

In another embodiment, please refer to FIGS. 3, 6, and 7. Specifically, FIG. 6 is a second cross-sectional view taken along line A-A' in FIG. 3. FIG. 7 is an enlarged view of portion B of FIG. 6.

In this embodiment, a structure of the display panel is similar/same as the semiconductor device provided in the above embodiment. For details, please refer to the description of the semiconductor device in the above embodiment, which will not be repeated here. This embodiment differs from the above-mentioned embodiment in that:

In this embodiment, the third active layer 43 is located on the sidewall 44C1 and the bottom 44C4 of the through hole 44C and extends to a side of the insulating layer 44 away from the insulating substrate 10. Specifically, the third active layer 43 includes a first active subsection 43A1 and a second active subsection 43A2 that are connected to each other. The first active subsection 43A1 is located on a side of the insulating layer 44 away from the insulating substrate 10 and is connected to the second active layer 42. The second active subsection 43A2 is connected to the first active layer 41 through the sidewall 44C1 of the through hole 44C. Specifically, the first active subsection 43A1 is connected to the second conductor portion 42, the second active subsection 43A2 is connected to the first conductor portion 41. In addition, an orthographic projection of the first conductor portion 41 on the insulating substrate 10 covers an orthographic projection of the second active subsection 43A2 on the insulating substrate 10, and an orthographic projection of the second conductor portion 42 on the insulating substrate 10 covers an orthographic projection of the first active subsection 43A1 on the insulating substrate 10.

In this embodiment, by means of the disposition that the orthographic projection of the second conductor portion 42 on the insulating substrate 10 covers the orthographic projection of the first active subsection 43A1 on the insulating substrate 10, a contact area between the second conductor portion 42 and the third active layer 43 is increased, thereby improving the stability of signal transmission.

Figure 8:
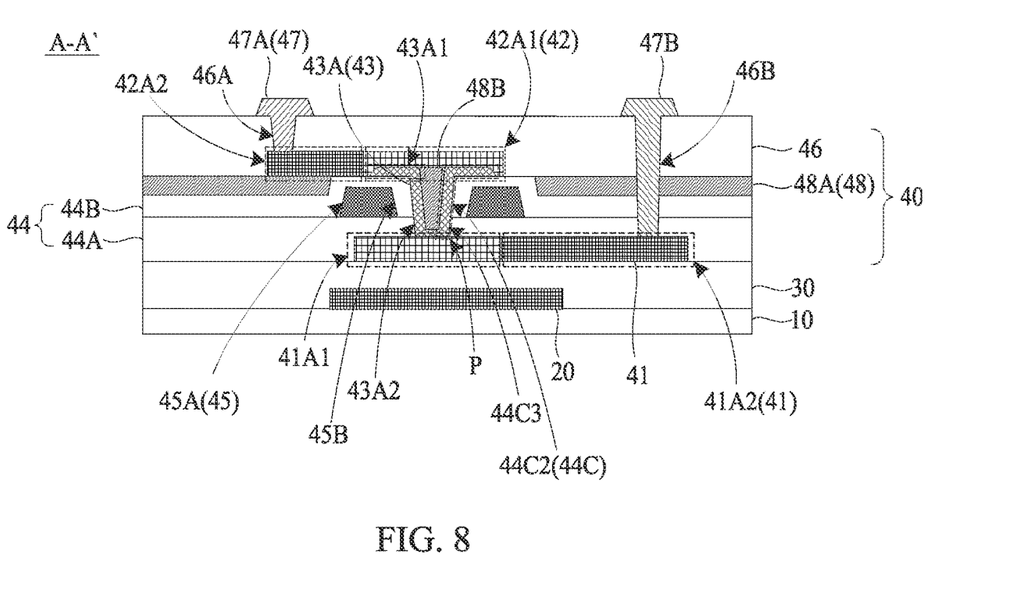
FIG. 8 is a third cross-sectional view taken along line A-A' in FIG. 3.
Figure 9:
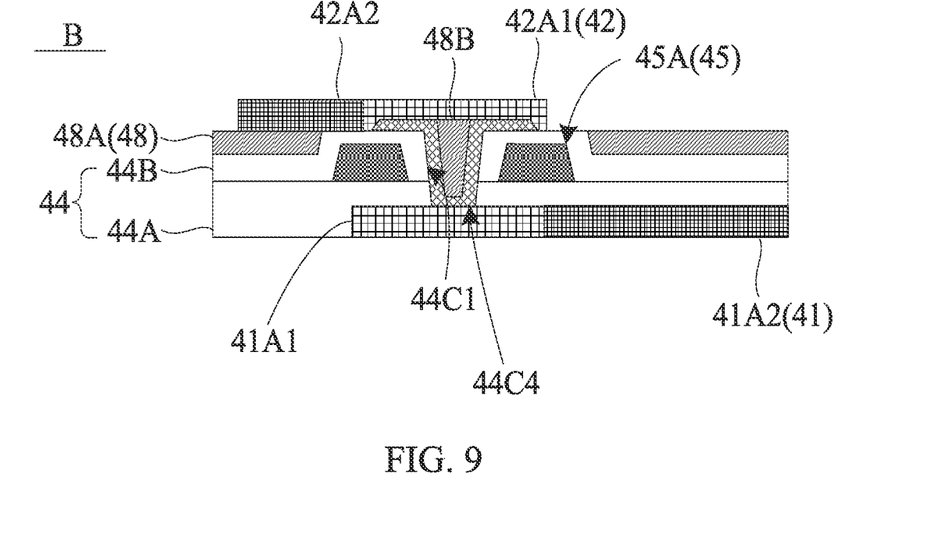
FIG. 9 is an enlarged view of portion B of FIG. 8.

In another embodiment, please refer to FIGS. 3 and 8. FIG. 8 is a third cross-sectional view taken along line A-A' in FIG. 3. FIG. 9 is an enlarged view of portion B of FIG. 8.

In this embodiment, a structure of the display panel is similar/same as the semiconductor device provided in the above embodiment. For details, please refer to the description of the semiconductor device in the above embodiment, which will not be repeated here. This embodiment differs from the above-mentioned embodiment in that:

In this embodiment, the second conductor portion 42 includes a third conductor sub-portion 42A1 connected to the third active layer 43, and a fourth conductor sub-portion 42A2 connected to the second electrode. Specifically, a dopant ion concentration of the first conductor sub-portion 41A1 is less than a dopant ion concentration of the second conductor sub-portion 41A2, and a dopant ion concentration of the third conductor sub-portion 42A1 is less than a dopant ion concentration of the fourth conductor sub-portion 42A2.

Specifically, in this embodiment, the first conductor sub-portion 41A1 is connected to one side of the third active layer 43, and the third conductor sub-portion 42A1 is connected to the other side of the third active layer 43. It can be understood that, in this embodiment, the first conductor sub-portion 41A1 with a smaller dopant ion concentration is connected to one side of the third active layer 43, and the third conductor sub-portion 42A1 with a smaller dopant ion concentration is connected to the other side of the third active layer 43, so that plasma gas in the first conductor portion 41 and the second conductor portion 42 can be prevented from diffusing in the direction toward the active segment 43A, so as to achieve the effect of maintaining the working stability of the thin-film transistor.

Figure 10:
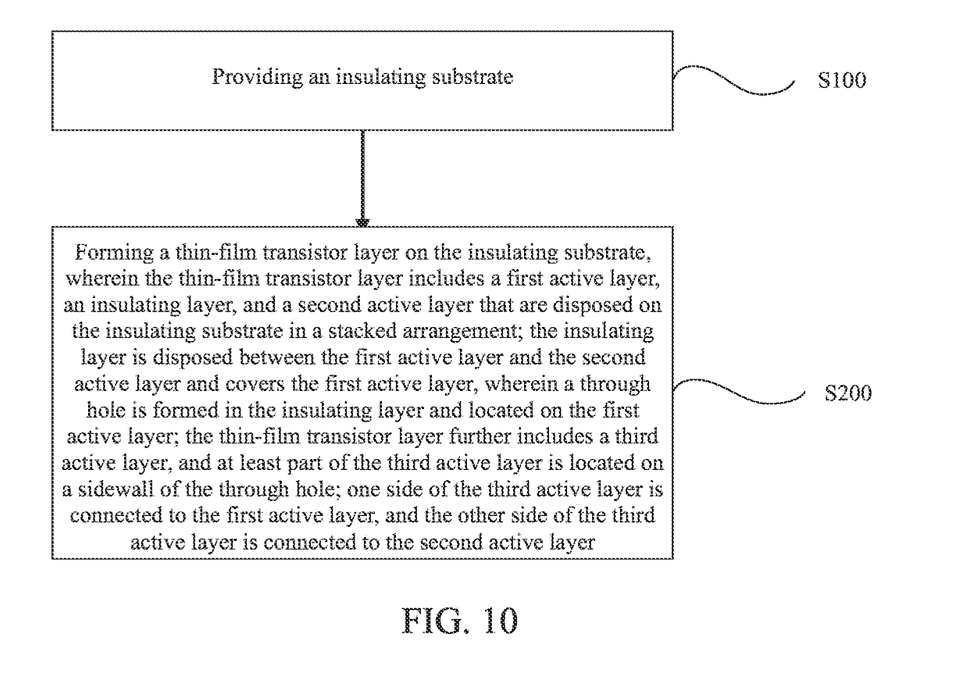
FIG. 10 is a flowchart of a method of manufacturing a semiconductor device according to an embodiment of the present application.

An embodiment of the present application further provides a method of manufacturing a semiconductor device. Please refer to FIGS. 6, 7, 10, and 11A to 11G. FIG. 10 is a flowchart of the method of manufacturing the semiconductor device according to an embodiment of the present application. FIGS. 11A to 11G are structural process flow diagrams for manufacturing the semiconductor device of FIG. 10.

In this embodiment, a method of manufacturing a semiconductor device of a vertical structure includes the following steps:

Step S100: providing an insulating substrate 10.

Specifically, when being a rigid substrate, a material of the insulating substrate 10 can be metal or glass. When being a flexible substrate, the insulating substrate 10 may be made of material including at least one of acrylic resin, methacrylic resin, polyisoprene, vinyl resin, epoxy-based resin, polyurethane-based resin, cellulose resin, silicone resin, polyimide-based resin, or polyamide-based resin.

Step S200: forming a thin-film transistor layer 40 on the insulating substrate 10. The thin-film transistor layer 40 includes a first active layer 41, an insulating layer 44, and a second active layer 42 that are disposed on the insulating substrate 10 in a stacked arrangement. The insulating layer 44 is disposed between the first active layer 41 and the second active layer 42 and covers the first active layer 41. Specifically, a through hole 44C is formed in the insulating layer 44 and located on the first active layer 41. The thin-film transistor layer 40 further includes a third active layer 43. At least part of the third active layer 43 is located on a sidewall 44C1 of the through hole 44C. One side of the third active layer 43 is connected to the first active layer 41, and the other side of the third active layer 43 is connected to the second active layer 42.

Figure 11A:
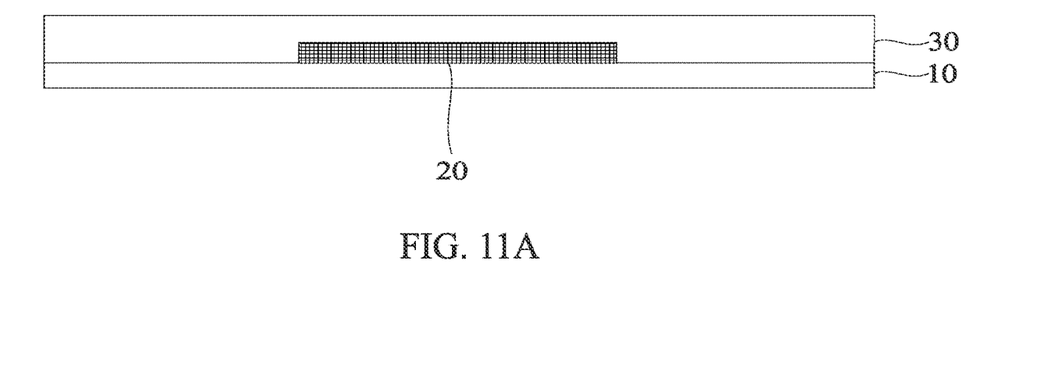
FIGS. 11A to 11G are structural process flow diagrams for manufacturing of the semiconductor device of FIG. 10.

Specifically, in this embodiment, prior to Step S200, the method of manufacturing the semiconductor device further includes the following steps:

Step S110: forming a light shielding layer 20 and a first buffer layer 30 on the insulating substrate 10 in sequence, as shown in FIG. 11A. A material of the light shielding layer 20 includes but is not limited to metal materials, and the metal materials include but are not limited to one or more alloys of molybdenum (Mo), titanium (Ti), and nickel (Ni). The material of the first buffer layer 30 includes but is not limited to single-layered silicon nitride (Si₃N₄), single-layer silicon dioxide (SiO₂), single-layered silicon oxynitride (SiON$_x$), or a dual-layered structure of the above layers.

It should be noted that, in this embodiment, the first active layer 41 includes a first conductor portion 41 doped with ions, and the second active layer 42 includes a second conductor portion 42 doped with ions. The third active layer 43 includes an active segment 43A located on the sidewall 44C1 of the through hole 44C, and an orthographic projection of the first conductor portion 41 on the insulating substrate 10 at least overlaps part of an orthographic projection of the second conductor portion 42 on the insulating substrate 10. One side of the active segment 43A is connected to the first conductor portion 41, and the other side of the active segment 43A is connected to the second conductor portion 41.

Specifically, in this embodiment, Step S200 includes the following steps:

Step S201: forming a first amorphous silicon layer on the buffer layer, and crystallizing the first amorphous silicon layer to form a first polycrystalline silicon film. Specifically, a layer of amorphous silicon material (a-si) is deposited on the buffer layer to form the first amorphous silicon layer, and excimer laser annealing (ELA) treatment is performed on the first amorphous silicon layer to form the first polysilicon film.

Step S202: patterning the first polysilicon thin film to form a first polysilicon pattern; specifically, a positive photoresist is used with a photomask to pattern the first polysilicon thin film through a yellow light and etching process, so as to form the first polysilicon pattern on the buffer layer.

Figure 11B:
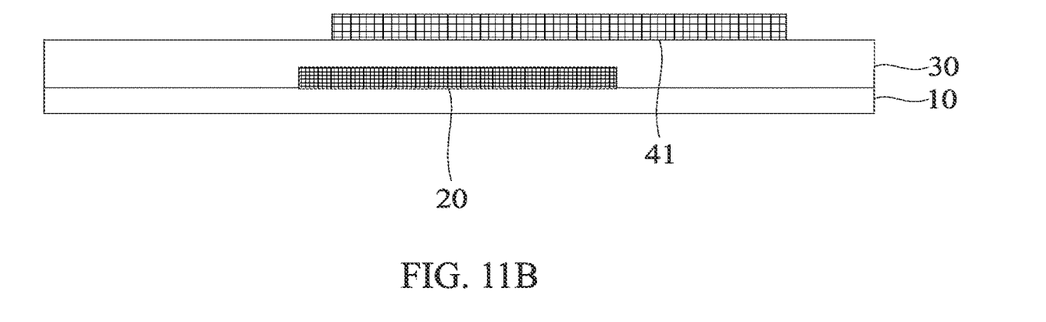

Step S203: performing ion implantation on the first polysilicon pattern to form the first conductor portion 41, as shown in FIG. 11B, wherein the ions doped in the first polysilicon pattern are boron ions or phosphorus ions.

Step S204: forming the first insulating layer 44B on the first conductor portion 41, wherein the second insulating layer 44A covers the first conductor portion 41, and a material of the first insulating layer 44B includes, but not limited to, single-layered silicon nitride (Si₃N₄), single-layered silicon dioxide (SiO₂), single-layered silicon oxynitride (SiON$_x$), or a dual-layered structure of the above layers.

Step S205: forming a gate 45A on a side of the second buffer layer 44 away from the first buffer layer 30, wherein a thickness of the gate 45A is greater than or equal to 0.05 microns and less than or equal to 0.2 microns, and a material of the gate 45A is a metal material including, but not limited, to at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), or tungsten (W).

Figure 11C:
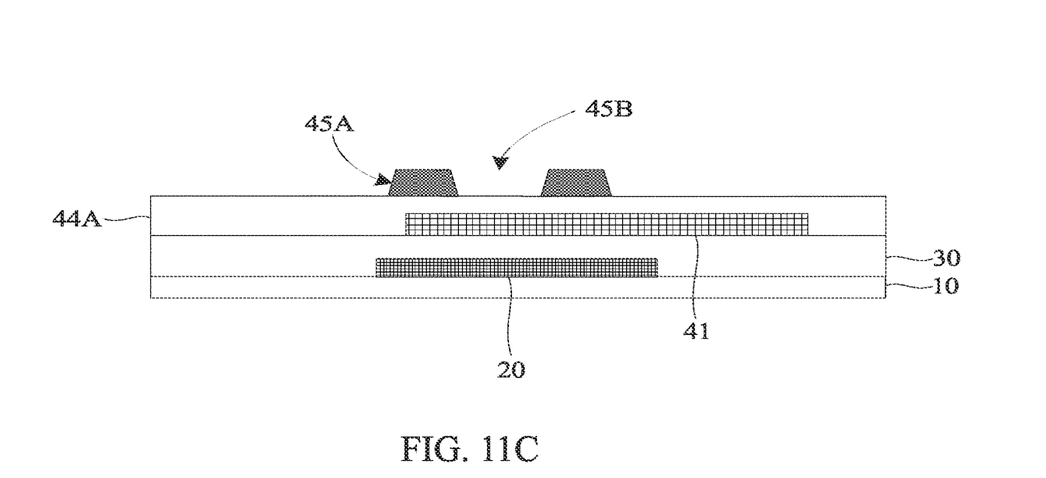

Specifically, Step S205 includes: forming a first metal layer 45 on the side of the second buffer layer 44 away from the first buffer layer 30, and patterning the first metal layer 45 to form the gate 45A, wherein an opening 45B is etched on the gate 45A and located above the first conductor portion 41, and the opening 45B extends through the gate 45A, as shown in FIG. 11C.

Step S206: forming a second insulating layer 44A on a side of the gate 45A away from the second buffer layer 44, wherein the second insulating layer 44A covers the gate 45A, so as to serve to block water and oxygen and to insulate the gate 45A. A material of the second insulating layer 44A includes but is not limited to single-layer silicon nitride (Si₃N₄), single-layer silicon dioxide (SiO₂), single-layer silicon oxynitride (SiON$_x$), or a double-layer structure of the above layers.

Figure 11D:
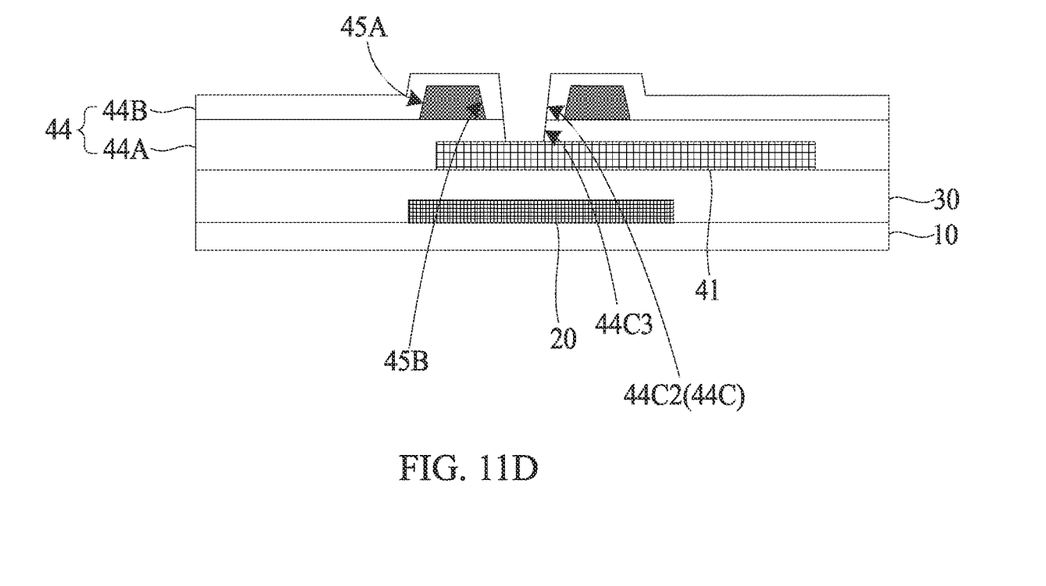

Step S207: through a photomask process, forming the through hole 44C in the second insulating layer 44A and the first insulating layer 44B and located on the first conductor portion 41. An aperture of the through hole 44C is less than an aperture of the opening 45B, so that the gate 45A is disposed around the third active layer 43 on the sidewall 44C1 of the through hole 44C. Specifically, the through hole 44C includes a first through hole 44C2 extending through the first insulating layer 44B, and a second through hole 44C3 extending through the second insulating layer 44A. The angle between the sidewall 44C1 of the second through hole 44C3 and the first active layer 41 is equal to the angle between the sidewall 44C1 of the first through hole 44C2 and the first active layer 41, as shown in FIG. 11D.

Step S208: forming the third active layer 43 on the side of the second insulating layer 44A away from the first insulating layer 44B, and at least part of the third active layer 43 is located on the sidewall 44C1 of the through hole 44C.

Figure 11E:
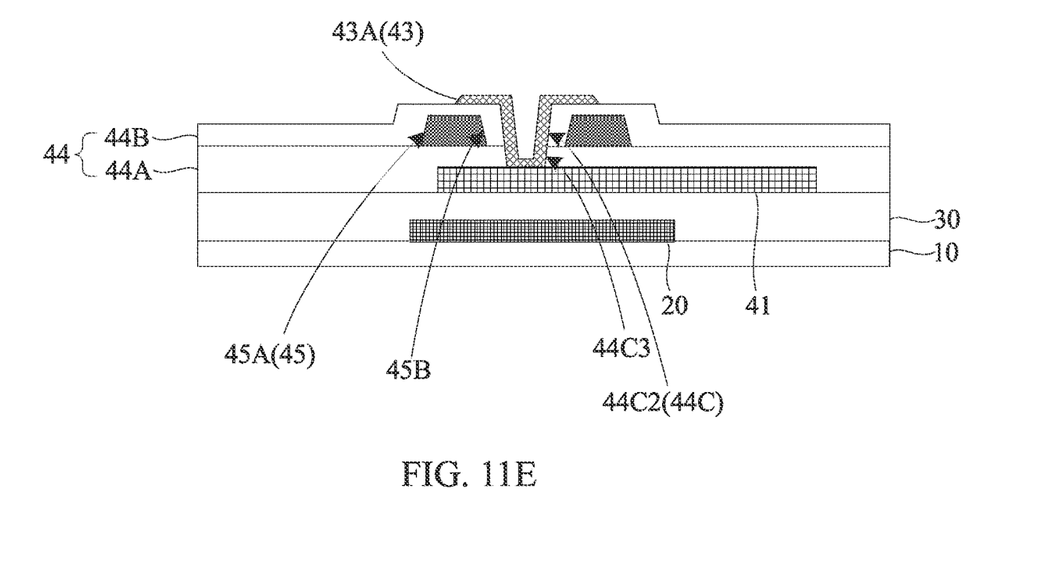

Specifically, the third active layer 43 is located on the sidewall 44C1 and the bottom 44C4 of the through hole 44C and extends to a side of the insulating layer 44 away from the insulating substrate 10. Specifically, the third active layer 43 includes a first active subsection 43A1 and a second active subsection 43A2 that are connected to each other. The first active subsection 43A1 is located on a side of the insulating layer 44 away from the insulating substrate 10. The second active subsection 43A2 is connected to the first active layer 41 through the sidewall 44C1 of the through hole 44C. In addition, an orthographic projection of the first conductor portion 41 on the insulating substrate 10 covers an orthographic projection of the second active subsection 43A2 on the insulating substrate 10, as shown in FIG. 11E.

Figure 11F:
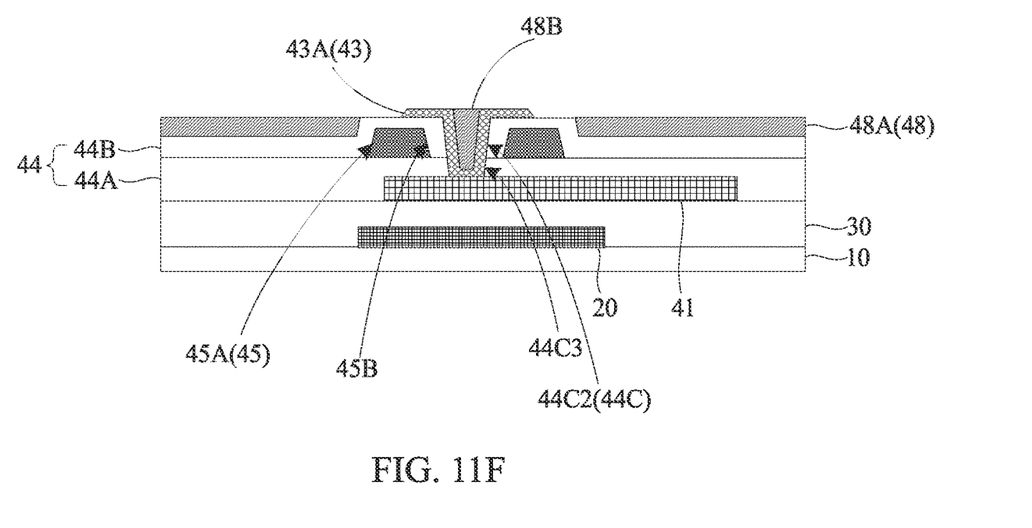

Step S209: forming a barrier layer 48 on the side of the second insulating layer 44A away from the first insulating layer 44B, and at least part of the barrier layer 48 is located in the through hole 44C. Specifically, the barrier layer 48 includes a first barrier portion 48A located on the side of the insulating layer 44 away from the insulating substrate 10, and a second barrier portion 48B located in the through hole 44C. A side of the first barrier portion 48A close to the second active layer 42 is flush with a side of the insulating layer 44 close to the second active layer 42. A side of the second barrier portion 48B close to the second active layer 42 is flush with the side of the insulating layer 44 close to the second active layer 42. Preferably, a material of the barrier layer 48 is silicon oxide (SiO$_x$), as shown in FIG. 11F.

Step S210: forming a second amorphous silicon layer on a side of the third active layer 43 away from the first conductor portion 41, and crystallizing the second amorphous silicon layer to form a second polycrystalline silicon film. Specifically, a layer of amorphous silicon material (a-si) is deposited on the third active layer 43 to form the second amorphous silicon layer, and an excimer laser annealing (ELA) process is performed on the second amorphous silicon layer to form the second polysilicon film.

Step S211: patterning the second polysilicon film to form a second polysilicon pattern. Specifically, positive photoresist is used with a photomask to pattern the second polysilicon film through a yellow light and etching process, so as to form the second polysilicon pattern on the third active layer 43.

Step S212: performing ion implantation on the second polysilicon pattern to form the second conductor portion 42, wherein the first active sub-portion 43A1 is connected to the second active layer 42, and the orthographic projection of the second conductor portion 42 on the insulating substrate 10 covers the orthographic projection of the first active sub-portion 43A1 on the insulating substrate 10.

Figure 11G:
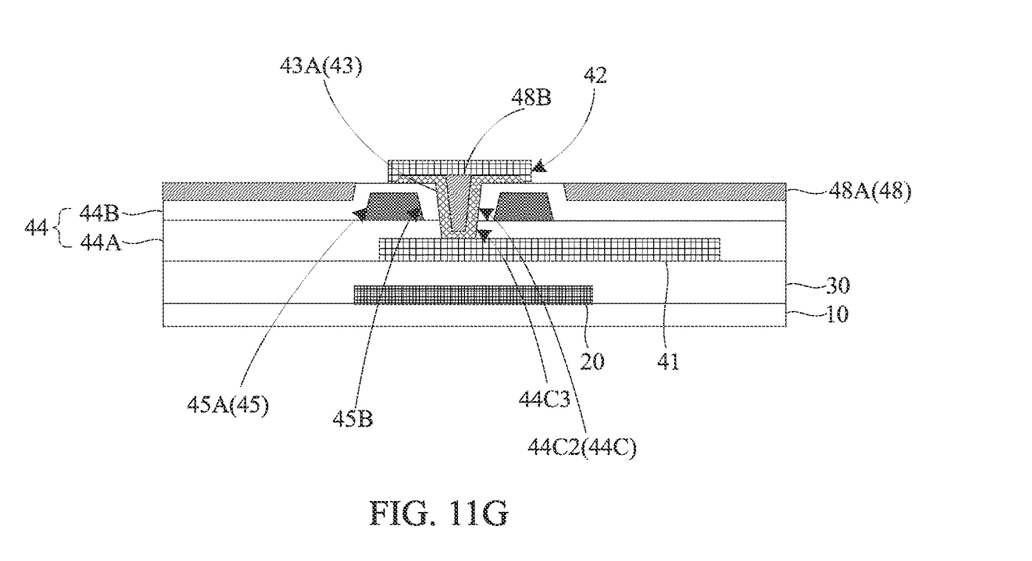

Specifically, the first conductor portion 41 includes a first conductor sub-portion 41A1 connected to the third active layer 43 and a second conductor sub-portion 41A2 connected to the first conductor sub-portion 41A1. An orthographic projection of the first conductor sub-portion 41A1 on the insulating substrate 10 at least overlaps part of an orthographic projection of the second conductor portion 42 on the insulating substrate 10. An orthographic projection of the second conductor sub-portion 41A2 on the insulating substrate 10 does not overlap the orthographic projection of the second conductor portion 42 on the insulating base 10, as shown in FIG. 11G.

Step S213: an interlayer dielectric layer 46 is formed on the side of the barrier layer 48 away from the second insulating layer 44A, and the interlayer dielectric layer 46 covers the barrier layer 48, the second conductor portion 42, and the second gate 45A.

Step S214: through a mask process, a first via hole 46A is formed on the interlayer dielectric layer 46, and a second via hole 46B is formed on the interlayer dielectric layer 46, the barrier layer 48, the first insulating layer 44B, and the second insulating layer 44A. Specifically, the first via hole 46A extends through the interlayer dielectric layer 46 and is located on the second conductor portion 42. The second via hole 46B extends through the interlayer dielectric layer 46, the barrier layer 48, the first insulating layer 44B, and the second insulating layer 44A, and is located on the second conductor sub-portion 41A2.

Step S215: forming a source electrode 47A and a drain electrode 47B on a side of the interlayer dielectric layer 46 away from the barrier layer 48. The source electrode 47A is connected to the second conductor portion 42 through the first via hole 46A, and the drain electrode 47B is connected to the second conductor portion 42 through the second via hole 46B, as shown in FIGS. 6 and 7.

This embodiment provides an electronic device, and the electronic device includes the semiconductor device described in any of the foregoing embodiments.

It can be understood that, the semiconductor device has been described in detail in the above embodiments, and the description will not be repeated here.

In specific applications, the electronic device can be a display screen of a smartphone, tablet computer, notebook computer, smart bracelet, smart watch, smart glasses, smart helmet, desktop computer, smart television, or digital camera, etc. The electronic device may even be applied to electronic equipment with flexible displays.

Accordingly, although the present application has been disclosed as a preferred embodiment, it is not intended to limit the present invention. Those skilled in the art without departing from the scope of the present invention may make various changes or modifications, and thus the scope of the present application should be after the appended claims and their equivalents.

What is claimed is:

1. A semiconductor device, comprising:
an insulating substrate; and
a thin-film transistor layer disposed on the insulating substrate and comprising a first active layer, an insulating layer and a second active layer that are sequentially stacked on the insulating substrate, wherein the insulating layer is disposed between the first active layer and the second active layer and covers the first active layer,
wherein the insulating layer is provided with a through hole opposite to the first active layer and the second active layer;
the thin-film transistor layer further comprises a third active layer, wherein at least part of the third active layer is disposed on a sidewall of the through hole, a side of the third active layer is connected to the first active layer, and an other side of the third active layer is connected to the second active layer; and
the first active layer comprises a first conductor portion doped with ions and the second active layer comprises a second conductor portion doped with ions, wherein an orthographic projection of the second conductor portion on the insulating substrate is within an orthographic projection of the first conductor portion on the insulating substrate.

2. The semiconductor device of claim 1, wherein the thin-film transistor layer further comprises a first metal layer disposed in the insulating layer and insulated from the first active layer, and the first metal layer is located at least on a side of the through hole.

3. The semiconductor device of claim 2, wherein the first metal layer is disposed around the at least part of the third active layer.

4. The semiconductor device of claim 1, wherein a concentration of ions doped into the second conductor portion is less than a concentration of ions doped into the first conductor portion.

5. The semiconductor device of claim 1, wherein the thin-film transistor layer further comprises a second metal layer disposed on a side of the second active layer away from the insulating layer, and the second metal layer comprises a first electrode connected to the first conductor portion and a second electrode connected to the second conductor portion; and
the first conductor portion comprises a first conductor sub-portion connected to the third active layer and a second conductor sub-portion connected to the first electrode, wherein an orthographic projection of the second conductor sub-portion on the insulating substrate does not overlap the orthographic projection of the second conductor portion on the insulating base.

6. The semiconductor device of claim 5, wherein the second conductor portion comprises a third conductor sub-portion connected to the third active layer and a fourth conductor sub-portion connected to the second electrode, a concentration of ions doped into the first conductor sub-portion is less than a concentration of ions doped into the second conductor sub-portion, and a concentration of ions doped into the third conductor sub-portion is less than a concentration of ions doped into the fourth conductor sub-portion.

7. The semiconductor device of claim 6, wherein the first conductor sub-portion is connected to the side of the third active layer, and the third conductor sub-portion is connected to the other side of the third active layer.

8. The semiconductor device of claim 1, wherein the thin-film transistor layer has a channel located between the first active layer and the second active layer, and a length of the channel and a depth of the through hole satisfy:

$$L \equiv \frac{H}{\operatorname{Sin}(\alpha)},$$

where L represents the length of the channel, H represents the depth of the through hole, and a represents an angle between the at least part of the third active layer and a bottom of the through hole.

9. The semiconductor device of claim 8, wherein α is greater than 90 degrees and less than or equal to 120 degrees.

10. The semiconductor device of claim 8, wherein the length of the channel in a direction perpendicular to the insulating substrate is greater than or equal to 3000 angstroms and less than or equal to 10000 angstroms.

11. The semiconductor device of claim 1, wherein the third active layer comprises a first active sub-portion and a second active sub-portion that are connected to each other, the first active sub-portion is disposed on a side of the insulating layer away from the insulating substrate and connected to the second active layer, and the second active sub-portion extends along the sidewall of the through hole and is connected to the first active layer.

12. The semiconductor device of claim 1, wherein the thin-film transistor layer further comprises a barrier layer disposed between the insulating layer and the second active layer, and at least part of the barrier layer is disposed in the through hole.

13. The semiconductor device of claim 12, wherein a side of the barrier layer close to the second active layer is flush with a side of the insulating layer close to the second active layer.

14. The semiconductor device of claim 12, wherein the third active layer is disposed on the sidewall and a bottom of the through hole and extends to a side of the insulating layer away from the insulating substrate.

15. An electronic device, comprising a semiconductor device, wherein the semiconductor device comprises:
an insulating substrate; and
a thin-film transistor layer disposed on the insulating substrate and comprising a first active layer, an insulating layer and a second active layer that are sequentially stacked on the insulating substrate, wherein the insulating layer is disposed between the first active layer and the second active layer and covers the first active layer;
wherein the insulating layer is provided with a through hole opposite to the first active layer and the second active layer;
the thin-film transistor layer further comprises a third active layer, wherein at least part of the third active layer is disposed on a sidewall of the through hole, a side of the third active layer is connected to the first active layer, and an other side of the third active layer is connected to the second active layer; and
the first active layer comprises a first conductor portion doped with ions and the second active layer comprises a second conductor portion doped with ions, wherein an orthographic projection of the second conductor portion on the insulating substrate is within an orthographic projection of the first conductor portion on the insulating substrate.

16. The electronic device of claim 15, wherein the thin-film transistor layer further comprises a first metal layer disposed in the insulating layer and insulated from the first active layer, and the first metal layer is located at least on a side of the through hole.

17. The electronic device of claim 15, wherein the third active layer comprises a first active sub-portion and a second active sub-portion that are connected to each other, the first active sub-portion is disposed on a side of the insulating layer away from the insulating substrate and connected to the second active layer, and the second active sub-portion extends along the sidewall of the through hole and is connected to the first active layer.

18. A semiconductor device, comprising:
an insulating substrate; and
a thin-film transistor layer disposed on the insulating substrate and comprising a first active layer, an insulating layer and a second active layer that are sequentially stacked the insulating substrate, wherein the insulating layer is disposed between the first active layer and the second active layer and covers the first active layer,
wherein the insulating layer is provided with a through hole opposite to the first active layer and the second active layer;
the thin-film transistor layer further comprises a third active layer, wherein at least part of the third active layer is disposed on a sidewall of the through hole, a side of the third active layer is connected to the first active layer, and an other side of the third active layer is connected to the second active layer;
the insulating layer comprises a first insulating sub-layer disposed on the first active layer to cover the first active layer, and a second insulating sub-layer disposed on the first insulating sub-layer to cover the first insulating sub-layer; and
the first insulating sub-layer is provided with a first through hole opposite to the first active layer, the second insulating sub-layer is provided with a second through hole opposite to the first through hole and the second active layer, an angle between a sidewall of the second through hole and the first active layer is equal to an angle between a sidewall of the first through hole and the first active layer, and the first through hole and the second through hole communicate with each other to form the through hole.

19. The semiconductor device of claim 18, wherein the thin-film transistor layer further comprises a first metal layer disposed in the insulating layer and insulated from the first active layer, and the first metal layer is located at least on a side of the through hole.

20. The semiconductor device of claim 19, wherein the first metal layer is disposed around the at least part of the third active layer.

* * * * *